United States Patent
Valcore, Jr. et al.

(10) Patent No.: US 8,440,061 B2
(45) Date of Patent: May 14, 2013

(54) SYSTEM AND METHOD FOR PLASMA ARC DETECTION, ISOLATION AND PREVENTION

(75) Inventors: John C. Valcore, Jr., San Jose, CA (US); Ed Santos, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 937 days.

(21) Appl. No.: 12/506,017

(22) Filed: Jul. 20, 2009

(65) Prior Publication Data

US 2011/0011730 A1    Jan. 20, 2011

(51) Int. Cl.
*C23C 14/54*    (2006.01)
*H01J 37/04*    (2006.01)

(52) U.S. Cl.
USPC ............ 204/298.08; 204/298.25; 204/298.26; 204/298.34; 204/298.06; 327/61; 327/325; 327/220; 327/314; 327/320

(58) Field of Classification Search ............ 204/298.25, 204/298.26, 298.34, 298.06, 298.08; 327/61, 327/325, 220, 314, 320
See application file for complete search history.

(56) References Cited

U.S. PATENT DOCUMENTS

| | | | |
|---|---|---|---|
| 5,399,252 A | * | 3/1995 | Scherer et al. ........... 204/298.19 |
| 6,072,683 A | * | 6/2000 | Masghati ....................... 361/119 |
| 6,198,616 B1 | * | 3/2001 | Dahimene et al. ............ 361/234 |
| 6,736,944 B2 | | 5/2004 | Buda |
| 2005/0103439 A1 | | 5/2005 | Goodman |
| 2007/0042131 A1 | | 2/2007 | Soo et al. |

* cited by examiner

*Primary Examiner* — Keith Hendricks
*Assistant Examiner* — Jason M Berman

(57) ABSTRACT

A device for use with an RF generating source, a first electrode, a second electrode and an element. The RF generating source is operable to provide an RF signal to the first electrode and thereby create a potential between the first electrode and the second electrode. The device comprises a connecting portion and a current sink. The connecting portion is operable to electrically connect to one of the first electrode, the second electrode and an element. The current sink is in electrical connection with the connection portion and a path to ground. The current sink comprises a voltage threshold. The current sink is operable to conduct current from the connecting portion to ground when a voltage on the electrically connected one of the first electrode, the second electrode and the element is greater than the voltage threshold.

7 Claims, 7 Drawing Sheets

SYSTEM AND METHOD FOR PLASMA ARC DETECTION, ISOLATION AND PREVENTION

BACKGROUND

In the semiconductor industry, plasmas are widely utilized in the processing of silicon wafers. Plasma chambers are typically used for the deposition and/or etching of material on/from a substrate. Given the dynamic state of plasma, there is a consistent need to detect and control the instantaneous discharge of electrons, known as an arc, between two nodes of differing potential. Arcing is a common problem in plasma processing systems for various reasons. First of all, since it involves rapid discharge, arcing can often be destructive and can destroy and/or wear down parts within the plasma chamber. Also, the presence of arcing can affect various process parameters, such as the deposition and/or etch rates, thereby causing non-uniformities on the processed wafer. Further, arcing can cause defects in the wafer surface, which ultimately reduces the yield of working semiconductor devices fabricated on the wafer. Thus, it is desirable to find an effective method to detect, isolate and prevent arcs from happening in a plasma chamber during wafer processing.

Arcing can be considered a form of instability within the plasma chamber. Since it is known that plasma instabilities can lead to difficulties in process control (which in turn can reduce process repeatability), methods have been developed to minimize plasma instabilities in general.

FIG. 1 is a block diagram of a conventional plasma processing system 100, which employs feedback control to minimize plasma instabilities. System 100 includes a plasma chamber 150, a power generator 110, a power modulator 120 and a signal detector 130.

In operation, power generator 110 directs power (e.g. RF power) to plasma chamber 150 via, for example, an antenna or capacitive-coupling device. The supplied power enables formation of the plasma. Signal detector 130 collects a signal from the plasma that is related to a parameter of the plasma, and can have a particular relationship or correlation to the parameter of the plasma (e.g. electron density, electron temperature, ion density, positive ion temperature). Power modulator 120 is operable to modulate the power produced by power generator 110, in response to the detected signal, to reduce an instability of the parameter of the plasma. In this manner, instabilities in the plasma are minimized by feedback control of the power supplied to plasma chamber 150.

However, this basic system can only control the power supplied to the plasma chamber; it cannot directly control instabilities that may occur inside the plasma chamber. Also, system 100 is mainly geared for minimizing general plasma instabilities, which may or may not be related to arcing. Therefore it is more desirable to employ a method and system that is specifically designed to diagnose arcing in plasma processing chambers.

FIG. 2 shows a flowchart illustrating a conventional method 200 for reducing arcing in a plasma processing chamber. The method 200 may start with the coupling of a voltage probe to the gas distribution faceplate (202) of the processing chamber and the subsequent measurement of the faceplate voltage (204). A high-speed voltage measurement device may be coupled to the voltage probe to generate a plot of the faceplate voltage measurements over time (206). The plot may include features (e.g. voltage spikes) that indicate arcing in the processing chamber, and these features may be used to diagnose and correct the underlying causes of the arcing.

In method 200, three adjustments are made to the plasma deposition process to reduce (or eliminate) arcing during the plasma deposition. These adjustments may include changing the RF power level (208), such as reducing the overall RF power supplied to the processing chamber. When multiple frequencies of RF power are supplied to the processing chamber, the power adjustment may be made to one or more RF frequencies (e.g. adjusting either the LF RF power level or the HF RF power level in a two-frequency RF source). Power level adjustments may also include decreasing or stopping the RF power before the end of the deposition to avoid arcing caused by voltage buildup in the process chamber.

Adjustments may also be made to the ramp rate at which the RF power is supplied to the processing chamber (210). In conventional PECVD deposition processes, the HF RF power is commonly ramped to the peak power level as fast as possible (e.g. 5000 watts/sec or faster) Adjustment to this ramp rate may include lowering the ramp rate for HF RF power and/or the LF RF power, and may also include ramping the power in steps instead of one continuous increase from zero watts to the peak power level.

Adjustments may further be made to the flow rates of one or more of the precursor gases (212) used to form the plasma. For example, in a plasma deposition of a fluorine-doped silicate glass (FSG) film, the flow rate of the silicon or fluorine precursor gas may be reduced to avoid arcing. The adjustments may also include a change in the timing of the introduction of one or more precursors to the processing chamber. For example, the introduction of a fluorine precursor may start before the RF power is activated to reduce arcing during the initial formation of the plasma in the processing chamber.

Depending on the characteristics of the deposition process, any combination of one or more of the adjustments 208, 210, and 212 maybe be implemented in order to reduce or to eliminate arcing.

While method 200 allows for the detection of disturbances seen within the bulk plasma (via observing spikes in plot of faceplate voltage, in step 206), it does not provide a means of feed forward mitigation of the arc (arcs can only be detected once they have happened; any adjustments made are for prevention of future arcs). Furthermore, method 200 does not provide any specific information regarding the arc (the location, duration, intensity, etc).

Other conventional arc detection systems involve monitoring of the power supplied to the plasma chamber and comparing chamber voltages and/or currents to a given threshold. For a given plasma processing system, the power supply to drive the process attempts to regulate power delivered to the chamber. The impedance of the chamber elements, (including the anode, cathode, and chamber environment) is in series with the impedance of the plasma-generating supply circuit. The relation between voltage and current to maintain a constant power in a plasma is dependent upon the impedance of the chamber elements. When an arc develops in a plasma chamber, the magnitude of the impedance of the chamber drops rapidly, thereby changing the impedance of the plasma-generating supply circuit. The power supply and distribution circuit contain significant series inductance, limiting the rate at which current can change in the circuit. A rapid drop in chamber impedance therefore causes a rapid decrease in the magnitude of chamber voltage due to this inductive component. Because the chamber voltage drops rapidly when an arcing event occurs, an unexpected voltage drop below a pre-defined or adaptive voltage threshold level can be used to define the occurrence of an arcing condition. This is the principle behind the conventional system shown in FIG. 3, as will be discussed below.

FIG. 3 illustrates another conventional plasma processing system 300, which employs an arc detection arrangement. Although, system 300 is a physical vapor deposition (PVD) system used for sputtering and deposition, the arc detection arrangement may be implemented in connection with other plasma systems, such as plasma etching systems.

System 300 includes a deposition chamber 310 containing a gas 315, such as argon, at lower pressure. A metal target 320 is placed in vacuum chamber 310 and electrically coupled as a cathode to a power supply 330 via an independent power supply interface module (PSIM) 340. Power supply 330 and chamber 310 are coupled using a coaxial interconnecting cable 335. A substrate (wafer) 325 is coupled as an anode to power supply 330 through a ground connection. Vacuum chamber 310 is also typically coupled to ground. A rotating magnet 327 is included to steer the plasma to maintain uniform target wear. PSIM 340 includes a buffered voltage attenuator 344 adapted to sense the chamber voltage and provide an analog signal to an Arc Detection Unit (ADU) 350 via a voltage signal path 342 responsive to the chamber voltage. PSIM 340 also includes a Hall effect-based current sensor 346 adapted to sense the current flowing to chamber 310 and provide an analog signal via a current signal path 348 to the ADU input responsive to the chamber current. ADU 350 is communicatively coupled to a logic arrangement 360, for example a programmable logic controller (PLC) via a local data interface 370. Logic arrangement 360 may be coupled to a data network 380, for example a high level process control network.

In operation, an electric field is generated between the target 320 (cathode) and substrate 325 (anode) by power supply 330 causing the gas in vacuum chamber 310 to ionize. Ionized gas atoms (e.g. plasma) are accelerated by electric field and impact the target at high speed, causing molecules of the target material to be physically separated from the target, or "sputtered". The ejected molecules travel virtually unimpeded through the low pressure gas and plasma striking the substrate and forming a coating of target material on substrate 325.

Via voltage signal path 342, ADU 350 monitors the voltage of chamber 310 and detects an arcing condition whenever the voltage magnitude drops below a preset arc threshold voltage value. Also, via current signal path 348, the current flowing, to chamber 310 is monitored and used in detecting arcing events, an arcing event being determined whenever the current magnitude exceeds a preset current threshold value. Threshold values are established by logic arrangement 360. ADU 350 may also be operable to count arcing conditions (events) responsive to at least one threshold. A rate of detected arcing donation occurrences may be determined therefrom. ADU 350 may also contain a clock and a digital counter in order to measure arc duration. In this manner, the quantity and severity (occurrences, duration, intensity, etc.) of arcing, in chamber 310 may be readily assessed, therefore allowing for an accurate estimate of possible damage to processed wafers.

Despite being able to closely monitor arcing, system 300 does not provide visibility into the arc location, and can only mitigate the effect of the arc after it has occurred. Since arcing often introduces defects/non uniformities in processed wafers, it is desirable to have a plasma processing system that is able to prevent arcs from occurring.

What is needed is a plasma processing system that is able to detect, isolate and/or prevent arcing inside the plasma chamber.

BRIEF SUMMARY

It is an object of the present invention to provide a system for use with a plasma processing system and method of operating a plasma processing system to detect, isolate and/or prevent arcing inside the plasma chamber.

In accordance with an aspect of the present invention, a device may be used with an RF generating source, a first electrode, a second electrode and an element. The RF generating source is operable to provide an RF signal to the first electrode and thereby create a potential between the first electrode and the second electrode. The device comprises a connecting portion and a current sink. The connecting portion is operable to electrically connect to one of the first electrode, the second electrode and the element. The current sink is in electrical connection with the connection portion and a path to ground. The current sink comprises a voltage threshold. The current sink is operable to conduct current from the connecting portion to ground when a voltage on the electrically connected one of the first electrode, the second electrode and the element is greater than the voltage threshold.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, a plasma processing system is equipped with a method for detecting, isolating, and preventing the presence of an arc inside a plasma chamber (specifically, an arc between the powered electrode and ground). This method is dependent upon a circuit placed in between the powered electrode and ground that includes an electronic component, whose resistance is a function of the voltage applied, such as a transistor or diode. The circuit is able to monitor and control the flow of current from the powered electrode to ground, thereby allowing for the detection and isolation of arcs, and in turn preventing arcs from occurring within the plasma chamber. Specific example embodiments in accordance with an aspect of the present invention will now be described with reference to FIGS. 4-12.

Figure 1:
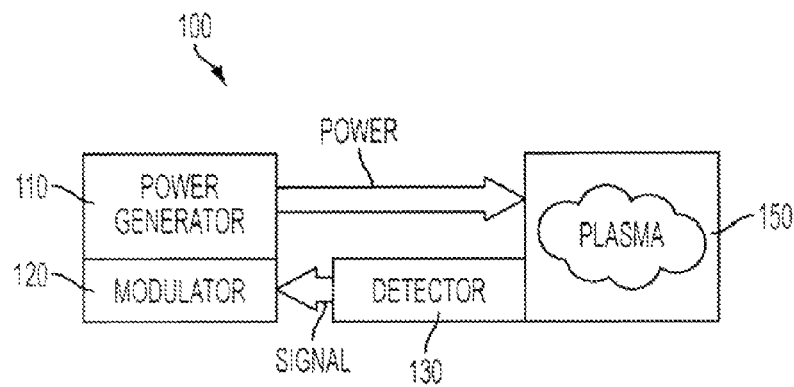
FIG. 1 is a block diagram of a conventional plasma processing system 100, which employs feedback control to minimize plasma instabilities.
Figure 2:
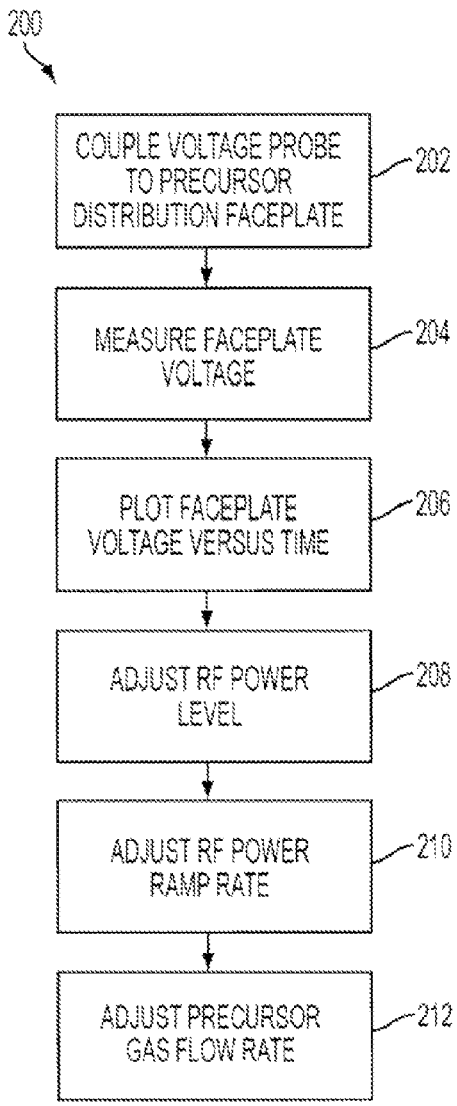
FIG. 2 shows a flowchart illustrating a conventional method 200 for reducing arcing in a plasma processing chamber.
Figure 3:
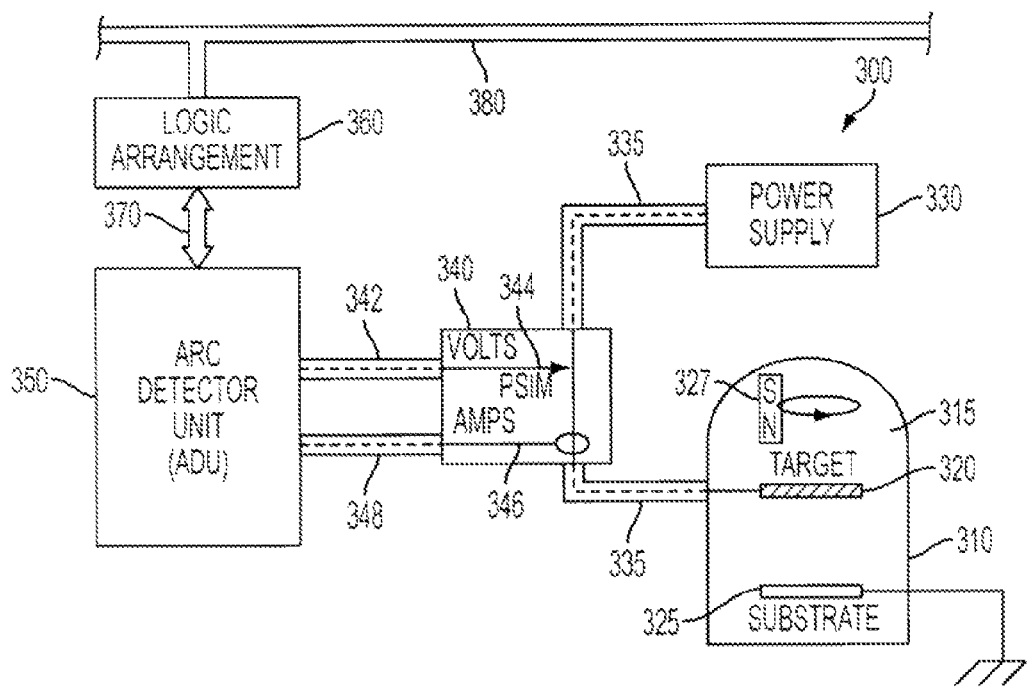
FIG. 3 illustrates another conventional plasma processing system 300 which employs an arc detection arrangement.
Figure 4:
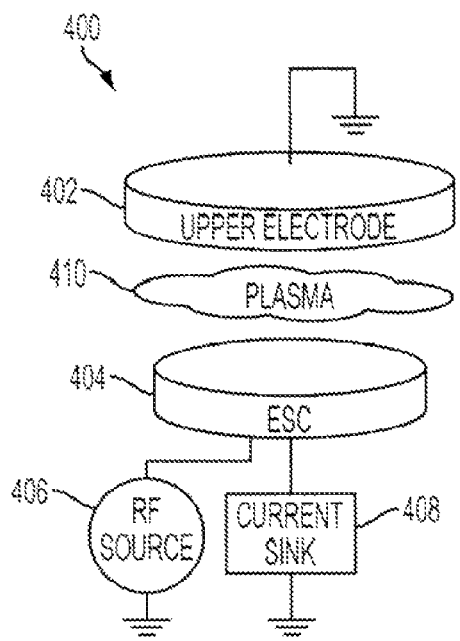
FIG. 4 illustrates a capacitively-coupled RF plasma processing system 400 with an arc prevention device in accordance with an aspect of the present invention.

FIG. 4 illustrates a capacitively-coupled RF plasma processing system 400 with an arc prevention device in accordance with an aspect of the present invention. System 400 includes an upper electrode 402, electrostatic chuck (ESC) 404, an RF source 406, and a current sink 408. ESC 404 is electrically connected to RF source 406, while upper electrode 402 is grounded. Current sink 408 is electrically connected to ESC 404.

In operation, the RF potential supplied by RF source 406 allows plasma 410 to form between ESC 404 and upper electrode 402. Due to the applied RF potential, charge builds up on ESC 404. Because of non-uniformities in the geometry of ESC 404, there will be non-uniformities in the RF voltage along the surface of ESC 404. These non-uniformities will cause some areas of charge buildup on ESC 404 that can potentially cause an arc to occur within the chamber (between ESC 404 and upper electrode 402).

Thus, in order to prevent the occurrence of an arc, current sink 408 is operable to drain excess charge from ESC 404 to ground. Current sink 408 is designed to act as an open circuit when its voltage (same as the voltage of ESC 404) is consistent with standard plasma chamber operating conditions. When the voltage of ESC 404 exceeds a predetermined threshold, current sink 408 is designed to become conducting and therefore acts as a current sink to drain charge from ESC 404. In this manner, current sink 408 acts similar to a "fuse" in that it is activated only when an "abnormal" voltage occurs, which indicates an arc may occur.

An example embodiment of current sink 408 in accordance with an aspect of the present invention will now be described with reference to FIG. 5.

Figure 5:
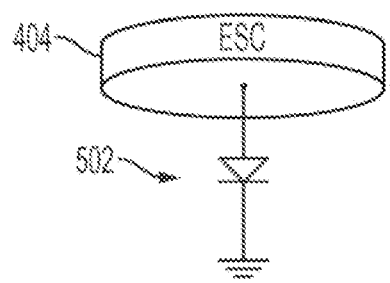
FIG. 5 shows an exploded view of ESC 404 from system 400 with a diode 502 being implemented as current sink 408.

FIG. 5 shows an exploded view of ESC 404 from system 400 with a diode 502 being implemented as current sink 408. Diode 502 is especially designed such that for all voltages consistent with standard plasma chamber operation, it is similar to an open circuit, carrying only negligible amounts of current. For all other voltages, diode 502 acts as a conductor and therefore drains charge from ESC 404 to ground. In this manner, diode 502 works to prevent the occurrence of arcs.

Another example embodiment of current sink 408 in accordance with an aspect of the present invention will now be described below with reference to FIG. 6.

Figure 6:
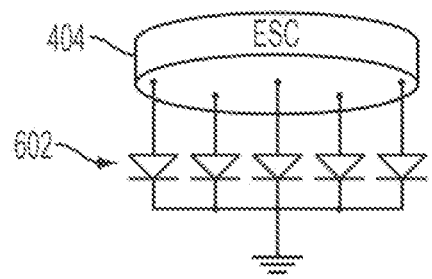
FIG. 6 shows an exploded view of ESC 404 from system 400 with a diode network 602 being implemented as current sink 408.

FIG. 6 shows an exploded view of ESC 404 from system 400 with a diode network 602 being implemented as current sink 408. As shown in the figure, diode network 602 includes a plurality of diodes attached to ESC 404 at various locations.

Each individual diode, as discussed above, acts as like an open or closed switch depending on the voltage applied to ESC 404. The advantage of having diode network 602, as opposed to a single diode 502 as discussed above with reference to FIG. 5, is that the plurality of diodes enables a more precise determination as to where an arc would have occurred. Specifically, by noting which diode(s) within diode network 602 conduct current, for example by any known diode monitoring system or method, the exact position(s) on ESC 404 at which an arc would have occurred may be determined. In this manner, system 400 can not only prevent the occurrence of arcs, but can also isolate the location of potential arcs.

An example method of arc prevention in accordance with the present invention will now be described with reference to FIG. 7.

Figure 7:
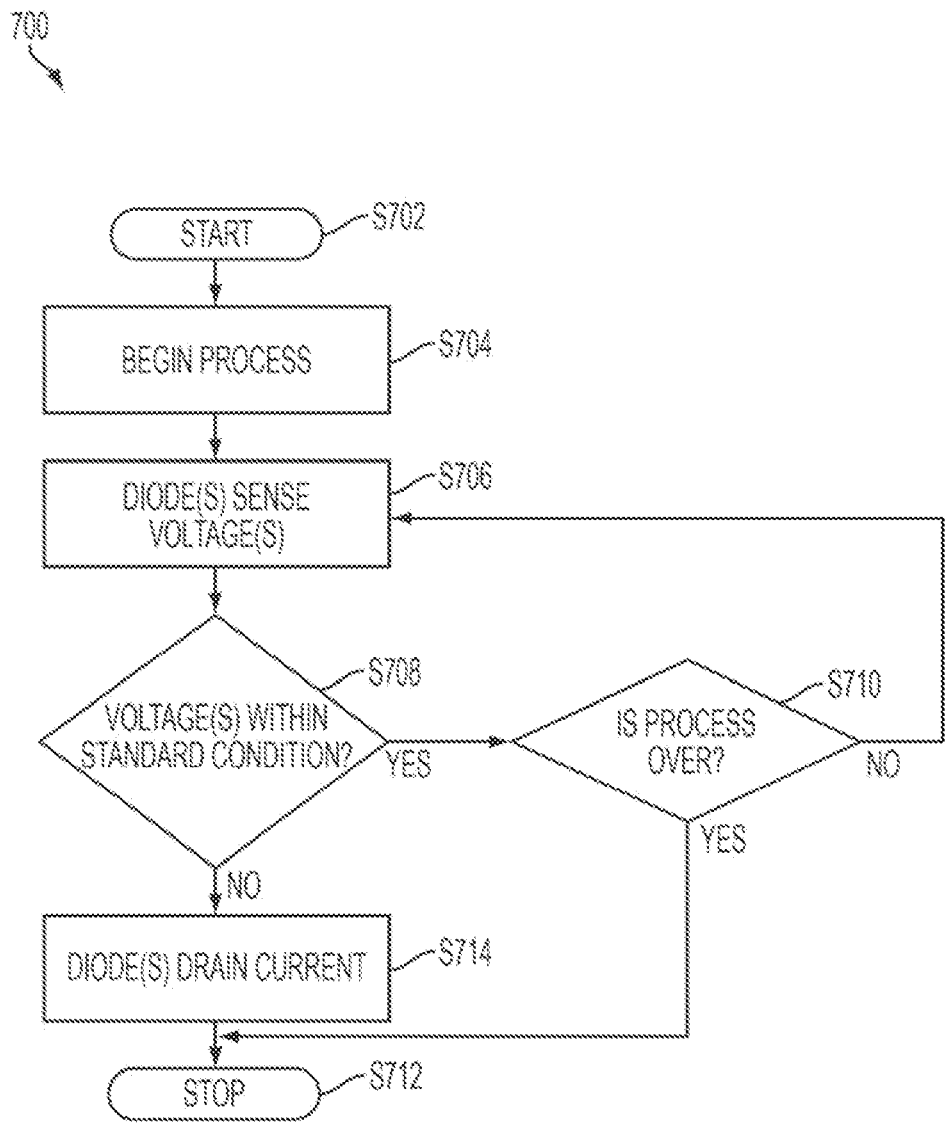
FIG. 7 is a flowchart of an example algorithm 700 of implementing arc prevention within system 400 in accordance with an aspect of the present invention.

FIG. 7 is a flowchart of an example algorithm 700 implementing arc prevention within system 400 in accordance with an aspect of the present invention. In this example, it is assumed that either a single diode (such as diode 502) or a diode network (such as diode network 602) is implemented as current sink 408.

Algorithm 700 starts (S702) and the plasma chamber is activated such that system 400 begins processing (S704) a wafer. For example, RF source 406 may be activated to supply RF power to ESC 404 such that a plasma may be formed in the chamber.

Then, during processing, current sink 408 senses the local voltage(s) on ESC 404 (S706).

It is then determined whether the voltage on ESC 404 is consistent with prescribed wafer processing conditions (S708). If the voltage on ESC 404 is consistent with prescribed wafer processing conditions, e.g., if the voltage on ESC 404 is less than or equal to the predetermined threshold of current sink 408, then the wafer processing is progressing normally. In this case, current sink 408 remains like an open circuit and does not conduct current.

At this point, it is determined whether the wafer processing is complete (S710). If the wafer processing is complete, then algorithm 700 stops (S712). If the algorithm 700 is not complete, then current sink 408 continues to sense the voltage of ESC 404 (S706).

Returning to step S708, if the voltage on ESC 404 is not consistent with prescribed wafer processing conditions, e.g., if the voltage on ESC 404 is more than the predetermined threshold of current sink 408, then current sink 408 conducts current in order to drain current away from ESC 408 to ground (S714). After this, wafer processing stops, algorithm 700 stops (S712) and system 400 must be restarted to continue wafer processing.

Figure 8:
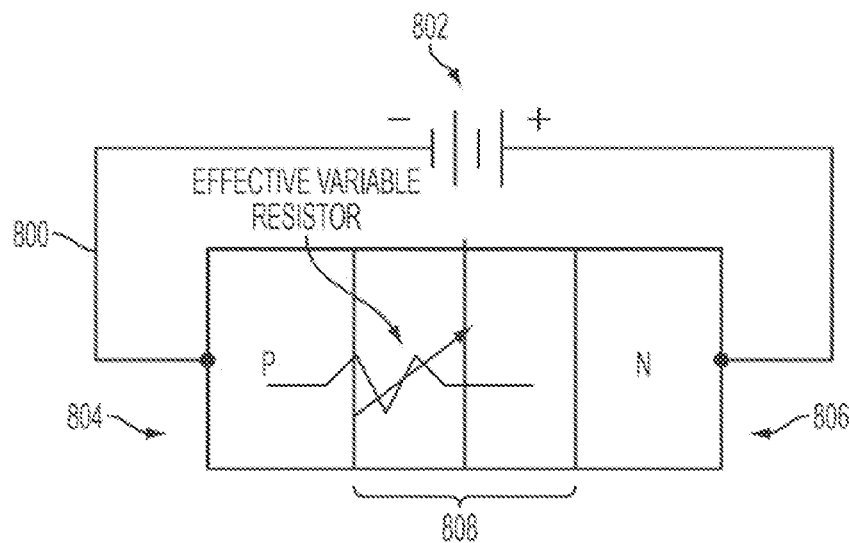
FIG. 8 illustrates a schematic of a diode 800 that may be used as diode 502 or in diode network 602.

In FIGS. 5 and 6, diodes are implemented in current sink 408 because of their variable resistance as a function of voltage, and their ability to turn "off" and "on" in terms of conducting current. FIG. 8 illustrates a schematic of a diode 800 that may be used as diode 502 or in diode network 602.

In the figure, diode 800 is shown being biased via a voltage source 802. Diode 800 includes a p-doped region 804, an n-doped region 806 and a depletion region 808. The polarity of voltage source 802, e.g., biasing n-doped region 806 higher than p-doped region 804, indicates that diode 800 is reverse biased. When diode 800 is reversed biased, depletion region 808 is very large and has a large potential drop, which acts as a barrier to current flow across diode 800. As a result, when diode 800 is reverse-biased, almost no current flows and the diode may be considered "off".

Returning to FIGS. 5-6, in system 400, during normal operation, the diode(s) in current sink 408 (diode 502 or diode network 602) are set up such that during normal operation, they are reverse-biased and therefore not conducting significant current, wherein they are considered "open", i.e., negligible current flow.

Figure 9:
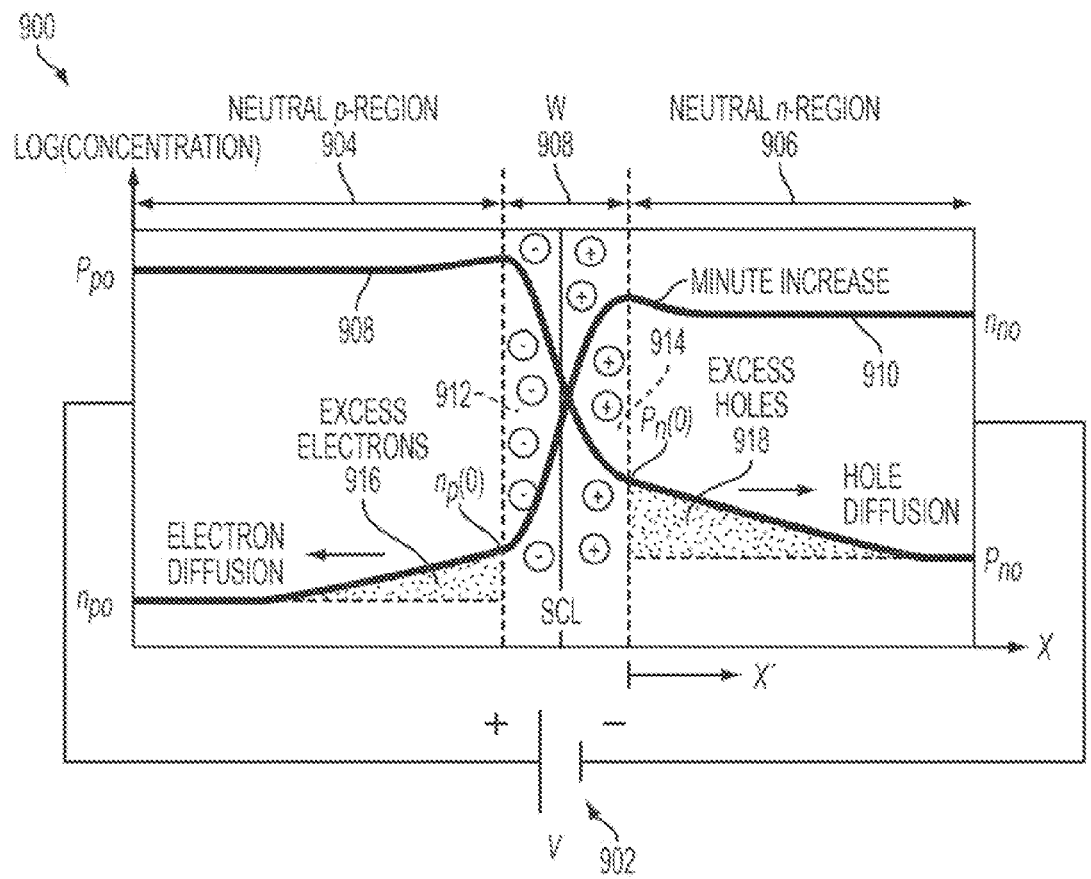
FIG. 9 illustrates a schematic of a diode 900 that is forward-biased.

FIG. 9 illustrates a schematic of a diode 900 that is forward-biased. In the figure, diode 900 is biased via a voltage source 902. Diode 900 includes a p-doped region 904, an n-doped region 906, and a depletion region 908. The polarity of voltage source 902, e.g., biasing p-doped region 904 higher than n-doped region 906, indicates that diode 900 is being forward-biased.

With diode 900 forward biased, depletion region 908 is relatively small and has little potential drop, therefore providing little barrier to current flow. A hole concentration curve 908 and an electron concentration curve 910 show the concentration of holes and electrons across diode 900. Hole concentration curve 908 and electron concentration curve 910 additionally illustrate how gradients in concentration cause excess electrons 916 and excess holes 918. These excess electrons 916 and excess holes 918 in turn cause electron and hole diffusion that makes up the flow of current. In this condition, during forward bias, a non-negligible amount of current flows through diode 900 and diode 900 may be considered "on".

Returning to FIGS. 4-6, in system 400, if either a single diode (such as diode 502 in FIG. 5) or a network of diodes (such as diode network 602 in FIG. 6) is implemented as current sink 408, then whenever the voltage across any diode (s) changes to exceed the threshold for prescribed wafer processing conditions (indicating local charge buildup and potential for an arc to occur), that diode then turns "on" to allow current flow, thus draining any excess charge build up to ground.

Diode(s) implemented in current sink 408 may be designed such that a specific doping of the n and p regions as well as its geometry (width, area, etc) may enhance its characteristics as an arc prevention device. A diode's varying susceptibility to current flow allows for the controlled dissipation of charge and thus prevents catastrophic arc events from occurring by dictating the exact current path.

In system 400, a peak detector may also be added to monitor and detect the presence of arcs sensed by diodes in current sink 408. If a peak detector is implemented and a plurality of diodes (such as diode network 602) is implemented as current sink 408, then system 400 has the ability to detect, prevent, and isolate the occurrence of arcs in the plasma chamber. These capabilities not only help prevent any damage to the chamber due to arcing, but can help provide more insight into why an arc may occur, based on its location.

Figure 10:
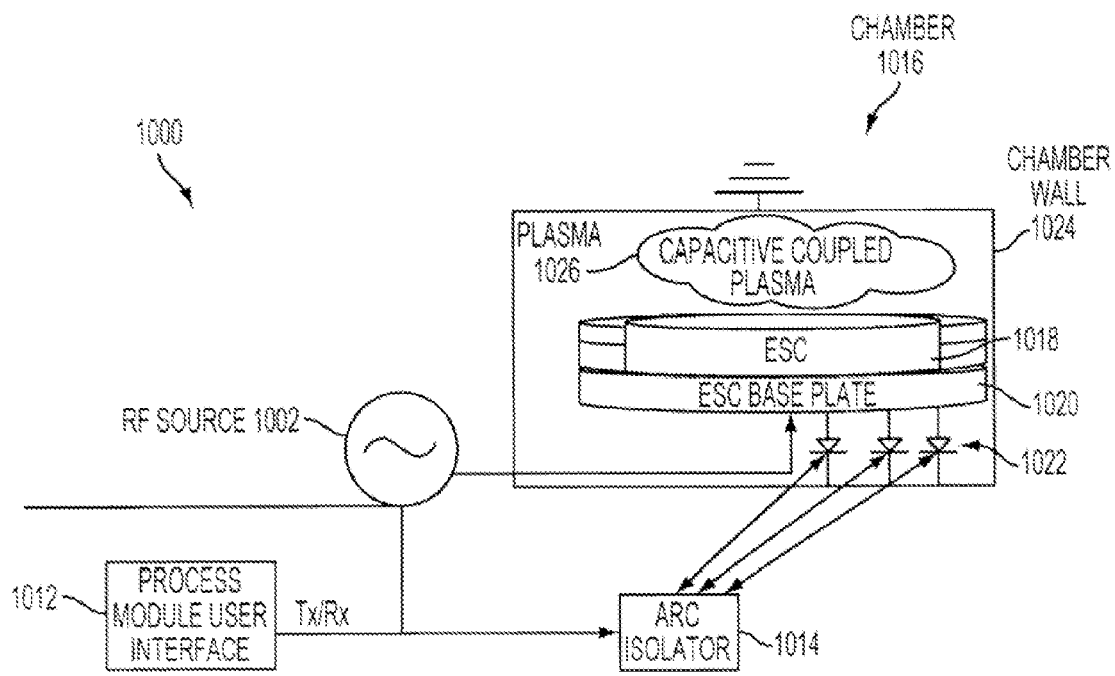
FIG. 10 illustrates a capacitively-coupled RF plasma processing system 1000 with an arc isolation device monitored by a controller in accordance with an aspect of the present invention.

System 400 may include a controller to monitor individual elements of an arc prevention device. FIG. 10 illustrates a capacitively-coupled RF plasma processing system 1000 with an arc isolation device monitored by a controller in accordance with an aspect of the present invention.

System 1000 includes an RF source 1002, a process module user interface 1012, an arc isolator 1014 and a plasma chamber 1016. Plasma chamber 1016 includes an ESC 1018, ESC base plate 1020 and a chamber wall 1024. Arc isolator 1014 includes a digital or analog controller (not shown) as well as a diode network 1022. Diode network 1022 is placed between ESC base plate 1020, which is powered via RF source 1002, and chamber wall 1024, which is grounded.

In operation, the RF potential supplied by source 1002 causes plasma 1026 to form in chamber 1016. Due to the applied RF potential, charge builds up ESC 1018 and on ESC base plate 1020. Due to non-uniformities in the geometry of ESC 1018 and ESC 1020, there will be non-uniformities in the RF voltage along ESC 1018 and ESC base plate 1020. These non-uniformities will cause some areas of charge buildup on ESC 1018 and ESC base plate 1020 that can potentially cause an arc to occur between ESC base plate 1020 and ground (chamber wall 1024).

Thus, in order to detect and pinpoint the location of an arc, one can monitor the voltage at various locations along ESC base plate 1020. This is done via diode network 1022 of arc isolator 1014.

Diode network 1022 is placed in parallel with the capacitor formed by the chamber electrodes, e.g., ESC base plate 1020 and chamber wall 1022, in such a direction as to inhibit the flow of current across diode network 1022 for all voltages consistent with standard plasma chamber operation. The diodes in diode network 1022 may be arranged in a predetermined arrangement to cover the area of ESC base plate 1020. Whenever a voltage changes somewhere on ESC base plate 1020, i.e., indicating local charge buildup, this will cause the local diode in diode network 1022 to "turn on" and drain the extra charge to ground. In this manner, arcs are prevented from even occurring. Also, by monitoring all the diode voltages and currents via arc isolator 1014, one can not only detect the presence of arcs but can also isolate their specific location based on which diode(s) turned on.

In system 1000, the charge buildup on ESC base plate 1020 and ESC 1018 is monitored in order to control the path of leakage current to ground. In other embodiments, the charge and leakage current of other chamber components may be monitored and controlled in order to prevent arcing.

So far, embodiments involving passive devices have been discussed, in which diode(s) implemented as current sinks switch on and off based only on their specific properties (doping, geometry, etc). In this case, diodes for use in current sinks must be carefully designed to switch at a desired voltage threshold appropriate for the plasma processing conditions. If the voltage threshold ever needed to be changed; then it would require replacement of the diodes used in the current sink. It is therefore desirable to implement a controllable arc prevention device that can be adjusted to accommodate different voltage thresholds that may result from different plasma processing conditions. Another advantage for using individually controllable devices would be that it can allow for more precise control of the voltage along the connected device (e.g. an ESC). This type of embodiment will be further discussed in reference to FIGS. 11 and 12.

Figure 11:
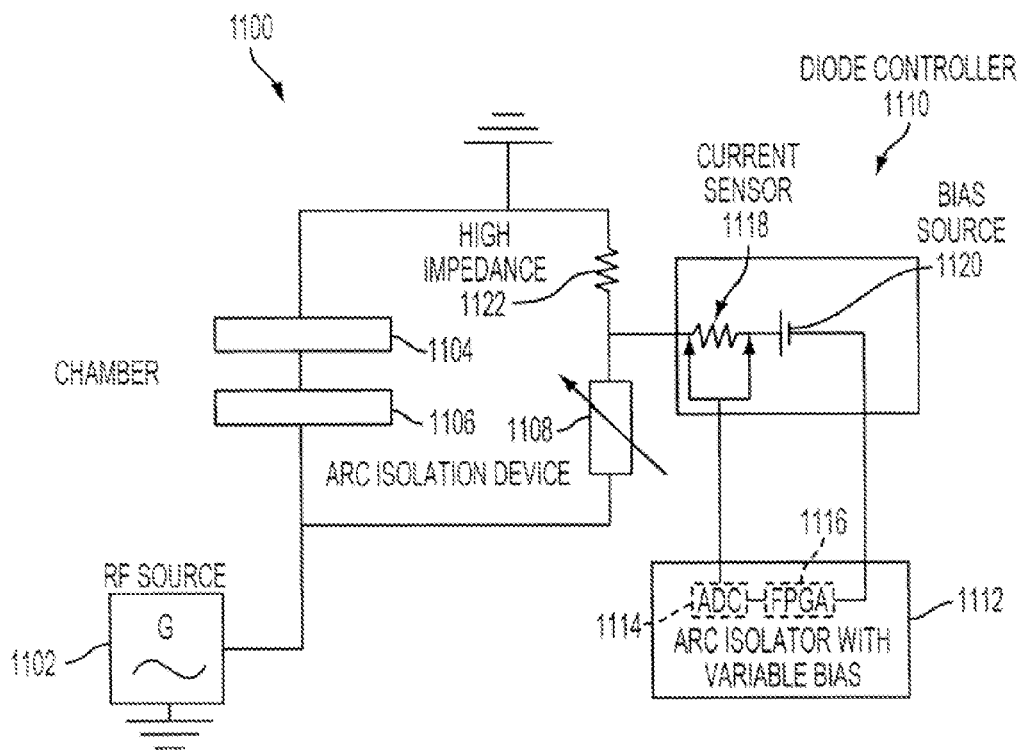
FIG. 11 is a schematic diagram of a capacitively coupled RF chamber system 1100 with an arc isolation device, a variable voltage source and a current sensor, in accordance with an aspect of the present invention.

FIG. 11 is a schematic diagram of a capacitively coupled RF chamber system 1100 in accordance with an aspect of the present invention.

System 1100 includes an RF source 1102, an upper electrode 1104, a lower electrode 1106, an arc isolation device 1108, a diode controller 1110 and an arc isolator 1112 and a high impedance resistor 1122. Arc isolation device 1108 may include a network of diodes, such as diode network 1022 of system 1000. Diode controller 1110 includes a current sensor 1118 and a variable bias source 1120. Arc isolator 1112 includes an analog-to-digital converter (ADC) 1114 and a field programmable gate array (FPGA) 1116.

In operation, RF source 1102 provides RF power to lower electrode 1106, while upper electrode 1104 is grounded. A plasma (not shown) forms between upper electrode 1104 and lower electrode 1106. High impedance resistor 1122 is disposed between arc isolation device 1108 and ground such that the bias voltage from bias source 1120 is mostly drawn across arc isolation device 1108. Further, high impedance resistor 1122 forces most of the current running through arc isolation device 1108 to current sensor 1118 instead of being drawn to ground.

Current sensor 1118 detects leakage current across arc isolation device 1108. ADC 1114 samples the voltage across current sensor 1118. FPGA 1116 applies a peak detection algorithm to determine an arc event, as well as to maintain the appropriate set point to bias source 1120. Bias source 1120 has an independent voltage output for each diode in diode network 1022. Therefore one can precisely adjust the voltage across lower electrode 1106, thereby improving the uniformity of the resulting plasma. Also, by monitoring the currents and voltages of individual diodes, one can pinpoint the location where an arc may potentially occur. In this manner, during operation the presence of potential arcing events are easily detected, isolated, and prevented.

Figure 12:
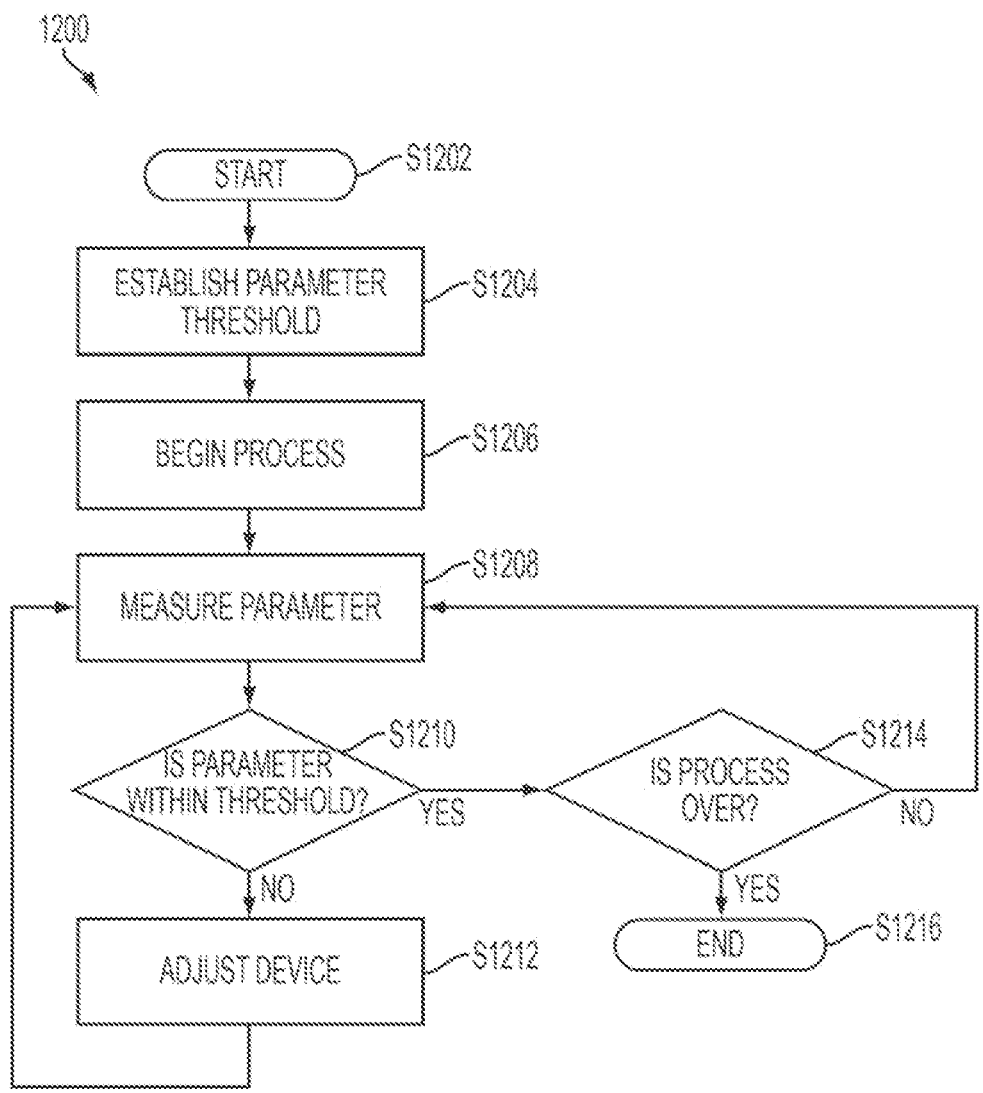
FIG. 12 is a flowchart of an example algorithm 1200 of implementing arc detection within system 1200 in accordance with an aspect of the present invention.

The method of arc detection, isolation and prevention of system 1100 while wafer processing will now be more explicitly explained with reference to FIG. 12. FIG. 12 is a flowchart of an example method 1200 of implementing arc detection within system 1200 in accordance with an aspect of the present invention.

Method 1200 starts (S1202) and a parameter threshold for identifying potential arcs is established (S1204). The parameter may be a voltage, current, or another parameter that will be monitored in order to identify the potential presence of an arc. For example, one may establish a threshold of leakage current sensed by current sensor 1218, such that above a certain leakage threshold, a non-uniformity in voltage or charge on lower electrode 1206 is assumed, which may indicate a potential for an arc to occur.

Then the plasma chamber is activated such that system 1100 begins wafer processing (S1206). For example, RF source 1202 may be activated to supply RF power to lower electrode 1206 such that a plasma may be formed between upper electrode 1104 and lower electrode 1106.

Then, the parameter used to identify arcs is measured (S1208). For example, if a leakage current through current sensor 1218 is the parameter being monitored, then ADC 1214 samples this current.

At this point it is determined whether the monitored parameter is within the established threshold (S1210). For example, if the leakage current through current sensor 1218 is the monitored parameter, FPGA 1216 compares it to the established leakage current threshold.

If the monitored parameter is within the threshold, then the wafer processing is progressing normally and it is determined whether the process is complete (S1214). If the process is complete, then the wafer processing ends and the RF power is deactivated (S1216). If the wafer processing is not complete, then the parameter used to identify arcs is again measured (S1208).

Returning back to step S1210, if it is determined that the monitored parameter is not within the established parameter threshold, then arc isolation device 1108 is adjusted (S1212). For example, if sensor 1118 had sensed a leakage current that exceeded the established parameter threshold, then FPGA 1116 adjusts bias source 1120 to appropriately adjust the voltage across arc isolation device 1108. Arc isolation device 1108 then drains current such that the leakage current decreases to within the established parameter threshold. In this manner, arc isolation device 1108 is adjusted in order to achieve a more uniform distribution of voltage across the surface of lower electrode 1106, such that the occurrence of an arc may be prevented.

In an example embodiment, the implementation of arc isolation device 1108 as a network of diodes arranged on lower electrode 1106 allows for the isolation of the specific diode with increased leakage current, therefore allowing to pinpoint the location of detected non-uniformity.

After arc isolation device is adjusted, the monitored parameter is measured again (S1208). The sequence repeats until when in step S1214 the process is determined to be over and thus advances to step S1216 and the process ends.

The embodiments discussed above with reference to FIGS. 5, 6 and 8-11 employ diode(s) as current sink 408. Please note that other embodiments may employ other passive or active current sinking devices as current sink 408, non-limiting examples of which include transistors, varactors and potentiometers. Still further, other embodiments may use combinations of at least two of the group of non-limiting examples of passive or active current sinking devices as current sink 408.

The embodiments discussed above with reference to FIGS. 4-6 and 8-11 employ current sink 408 to sink current from an ESC, or an ESC base plate. Please note that other embodiments may employ current sink 408 to sink current from another electrode. Still further, other embodiments may use current sink 408 to sink current from another element within the system, non-limiting examples of which include a hot edge ring, a chamber wall gas input ports, and fastening devices. Additionally, other embodiments may use a plurality of current sinks to sink currents from a plurality of elements, respectively within the system, non-limiting examples of which include an ESC, an ESC base plate, a hot edge ring, a chamber wall gas input ports, and fastening devices.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device for use with an RE generating source, a first electrode, a second electrode and an element, the RE generating source being operable to provide an RF signal to the first electrode and thereby create a potential between the first electrode and the second electrode, said device comprising:
   a connecting portion operable to electrically connect to one of the first electrode, the second electrode and the element;
   a current sink in electrical connection with said connection portion and a path to ground; and
   a plurality of voltage sources,
   wherein said current sink comprises a voltage threshold and a plurality of diodes arranged in parallel,
   wherein each of said plurality of voltage sources is operable to provide a bias voltage to a corresponding one of said plurality of diodes, respectively,
   wherein said plurality of diodes is operable to change the voltage threshold based on the bias voltages provided by said plurality of voltage sources, and
   wherein said current sink is operable to conduct current from said connecting portion to ground when a voltage on the electrically connected one of the first electrode, the second electrode and the element is greater than the voltage threshold.

2. A system for use with an RF generating source, a first electrode, a second electrode and an element, the RF generating source being operable to provide an RF signal to the first electrode and thereby create a potential between the first electrode and the second electrode, said system comprising:

a first device having a first connecting portion and a first current sink; and a second device having a second connecting portion and a second current sink, wherein said first connecting portion is operable to electrically connect to a first portion of one of the first electrode, the second electrode and the element, wherein said second connecting portion is operable to electrically connect to a second portion of said one of the first electrode, the second electrode and the element, wherein said first current sink is in electrical connection with said first connection portion and a first path to ground, wherein said second current sink is in electrical connection with said second connection portion and a second path to ground, wherein said first current sink comprises a first voltage threshold, wherein said second current sink comprises a second voltage threshold, wherein said first current sink is operable to conduct current from said first connecting portion to the first path to ground when a first voltage on the electrically connected first portion of the one of the first electrode, the second electrode and the element is greater than the first voltage threshold, and wherein said second current sink is operable to conduct current from said second connecting portion to the second path to ground when a second voltage on the electrically connected second portion of the one of the first electrode, the second electrode and the element is greater than the second voltage threshold.

3. The system of claim 2, wherein said first connecting portion and said second connecting portion are connected to the same one of the first electrode, the second electrode and the element.

4. The system of claim 2, wherein the first voltage threshold is equal to the second voltage threshold.

5. The system of claim 2, further comprising:

a voltage source operable to provide a bias voltage to said first current sink, wherein said first current sink is operable to change the first voltage threshold based on the bias voltage provided by said voltage source.

6. The system of claim 5, wherein said voltage source is further operable to provide a second bias voltage to said second current sink, and wherein said second current sink is operable to change the second voltage threshold based on the second bias voltage provided by said voltage source.

7. A method of operating an RF generating source, a first electrode, a second electrode and an element, said method comprising:

establishing a voltage threshold in a current sink having a plurality of diodes arranged in parallel;

providing, via the RF generating source, an RF signal to the first electrode to thereby create a potential between the first electrode and the second electrode;

providing, via a plurality of voltage sources, a bias voltage to a corresponding one of the plurality of diodes, respectively, and sinking current, via the current sink, from one of the first electrode, the second electrode and the element to ground when a voltage on the one of the first electrode. the second electrode and the element is greater than the established voltage threshold in the current sink.

* * * * *